(12) United States Patent
Adury

(10) Patent No.: US 11,687,124 B2
(45) Date of Patent: Jun. 27, 2023

(54) COMPUTING DEVICE HINGE ASSEMBLY

(71) Applicant: Microsoft Technology Licensing, LLC, Redmond, WA (US)

(72) Inventor: Kashyap Adury, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/330,320

(22) Filed: May 25, 2021

(65) Prior Publication Data
US 2022/0382338 A1     Dec. 1, 2022

(51) Int. Cl.
*G06F 1/16*          (2006.01)
*H05K 5/02*          (2006.01)

(52) U.S. Cl.
CPC ......... *G06F 1/1681* (2013.01); *H05K 5/0226* (2013.01); *H05K 5/0234* (2013.01)

(58) Field of Classification Search
CPC ... G06F 1/1681; H05K 5/0234; H05K 5/0226
See application file for complete search history.

(56) References Cited

U.S. PATENT DOCUMENTS

| | | | |
|---|---|---|---|
| 4,821,375 A * | 4/1989 | Kozon | E06B 3/5045 312/331 |
| 6,530,179 B1 * | 3/2003 | Fisher | E06B 3/325 49/501 |
| 8,613,813 B2 * | 12/2013 | Johnson | C22C 45/00 219/121.11 |
| 9,044,800 B2 * | 6/2015 | Johnson | B21D 22/022 |
| 10,677,387 B2 * | 6/2020 | Han | F16M 11/10 |

(Continued)

FOREIGN PATENT DOCUMENTS

| CN | 208845564 U | 5/2019 |
|---|---|---|
| EP | 3644158 A1 | 4/2020 |

(Continued)

OTHER PUBLICATIONS

Photographs 1-3 of hinge from Surface Pro X tablet computer, manufactured by Microsoft, available on Oct. 2, 2019. 3 pages.

(Continued)

*Primary Examiner* — Rockshana D Chowdhury
*Assistant Examiner* — Douglas R Burtner
(74) *Attorney, Agent, or Firm* — Alleman Hall Creasman & Tuttle LLP

(57) ABSTRACT

Examples are disclosed relating to computing device hinge assemblies. In one example, a hinge assembly comprises a hinge frame affixed to one substrate and a hinge arm member affixed to another substrate. The hinge arm member comprises first and second arcuate arm guide slots. An arm support member, moveably coupling the hinge arm member to the hinge frame, comprises a first side comprising a first arcuate support guide slot receiving a first frame guide of the hinge frame, and a second side comprising a second arcuate support guide slot receiving a second frame guide. First and second arcuate inner support guides are received within the first and second arcuate arm guide slots of the hinge arm member. An elongated bridge member connects the first side of the arm support member to the second side, with the bridge member comprising a unitary structure fabricated from bulk metallic glass.

12 Claims, 6 Drawing Sheets

(56) References Cited

U.S. PATENT DOCUMENTS

| | | |
|---|---|---|
| 2009/0175020 A1 | 7/2009 | Zadesky |
| 2010/0220442 A1* | 9/2010 | Griffin ................ H04M 1/0216 |
| | | 361/679.56 |
| 2012/0073710 A1* | 3/2012 | Kim ...................... C22C 38/002 |
| | | 148/548 |
| 2013/0229100 A1 | 9/2013 | Siddiqui et al. |
| 2013/0229568 A1 | 9/2013 | Belesiu et al. |
| 2013/0229760 A1 | 9/2013 | Whitt et al. |
| 2013/0229762 A1 | 9/2013 | Whitt et al. |
| 2013/0335330 A1 | 12/2013 | Lane et al. |
| 2014/0185215 A1 | 7/2014 | Whitt et al. |
| 2014/0185220 A1 | 7/2014 | Whitt et al. |
| 2014/0204514 A1 | 7/2014 | Whitt et al. |
| 2014/0204515 A1 | 7/2014 | Whitt et al. |
| 2014/0247546 A1 | 9/2014 | Whitt et al. |
| 2014/0293534 A1 | 10/2014 | Siddiqui |
| 2015/0212553 A1 | 7/2015 | Park et al. |
| 2015/0342067 A1 | 11/2015 | Gault et al. |
| 2016/0090767 A1* | 3/2016 | Park .................... E05D 11/1042 |
| | | 16/319 |
| 2016/0209884 A1 | 7/2016 | Whitt et al. |
| 2016/0299537 A1 | 10/2016 | Whitt et al. |
| 2017/0068284 A1 | 3/2017 | Park et al. |
| 2018/0081404 A1 | 3/2018 | Schafer et al. |
| 2018/0129253 A1 | 5/2018 | Siddiqui |
| 2019/0064886 A1 | 2/2019 | Wendt |
| 2019/0078729 A1 | 3/2019 | Wendt |
| 2019/0179376 A1 | 6/2019 | Tomky et al. |
| 2019/0350096 A1* | 11/2019 | Chao ..................... G06F 1/1652 |
| 2020/0124229 A1* | 4/2020 | Han .................... H04M 1/0216 |
| 2021/0026406 A1* | 1/2021 | Kim ................... H04M 1/0268 |
| 2021/0373609 A1* | 12/2021 | Kim ........................ G06F 1/166 |
| 2022/0311843 A1* | 9/2022 | Kim ...................... G06F 1/1681 |

FOREIGN PATENT DOCUMENTS

| | | |
|---|---|---|
| JP | 4902520 B2 | 3/2012 |
| KR | 20200107556 A | 9/2020 |
| TW | I361035 B | 3/2012 |
| WO | 2012047651 A2 | 4/2012 |

OTHER PUBLICATIONS

"International Search Report and Written Opinion Issued in PCT Application No. PCT/US22/026857", dated Aug. 17, 2022, 13 Pages.

* cited by examiner

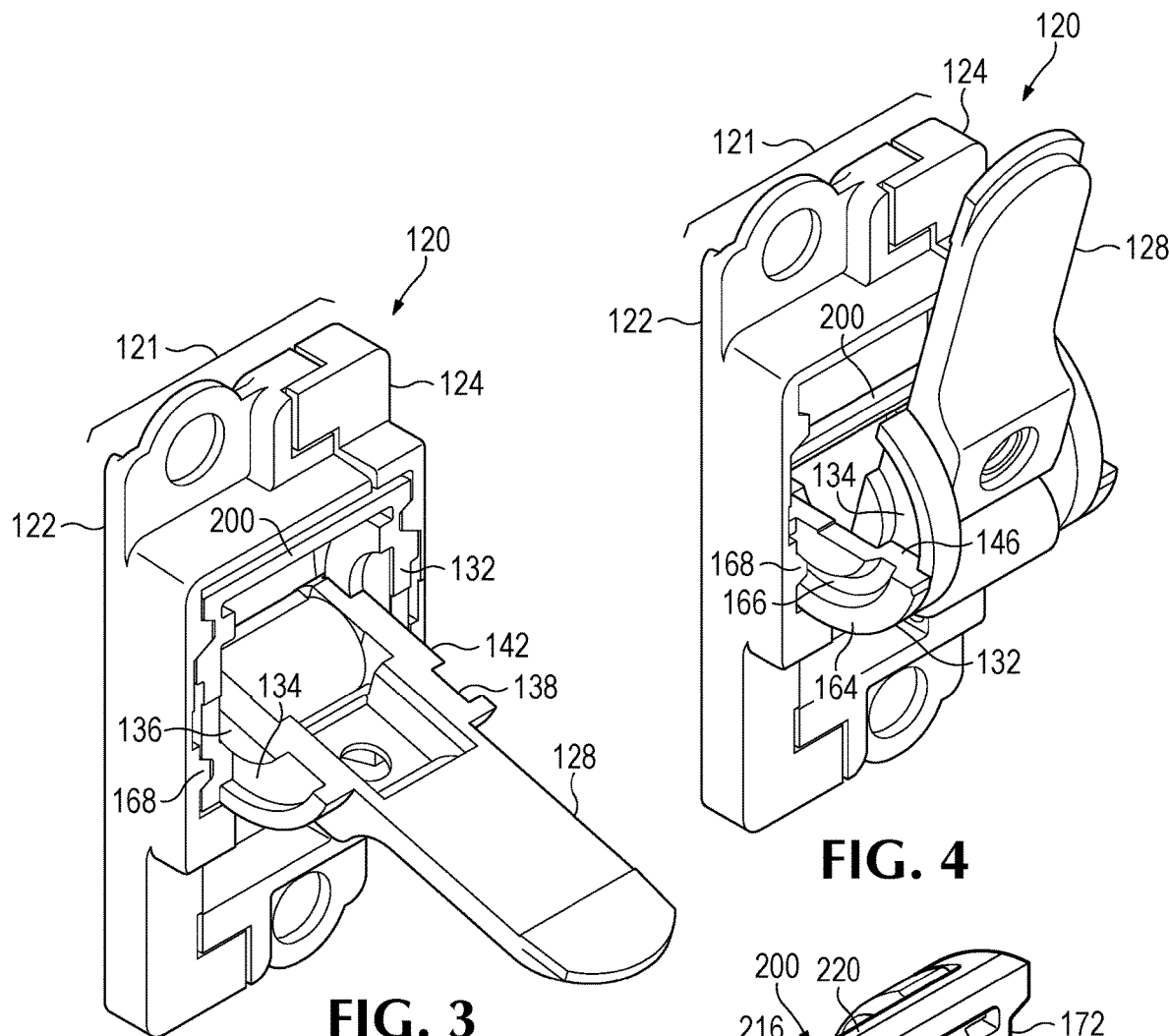
FIG. 3
FIG. 4
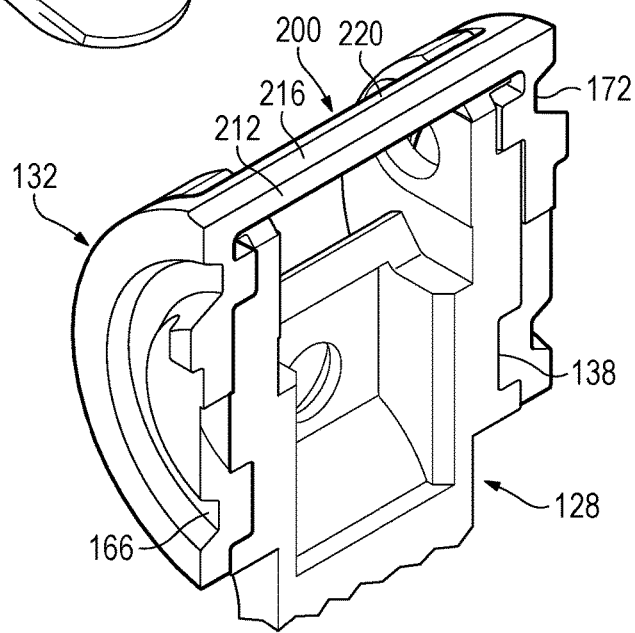
FIG. 5

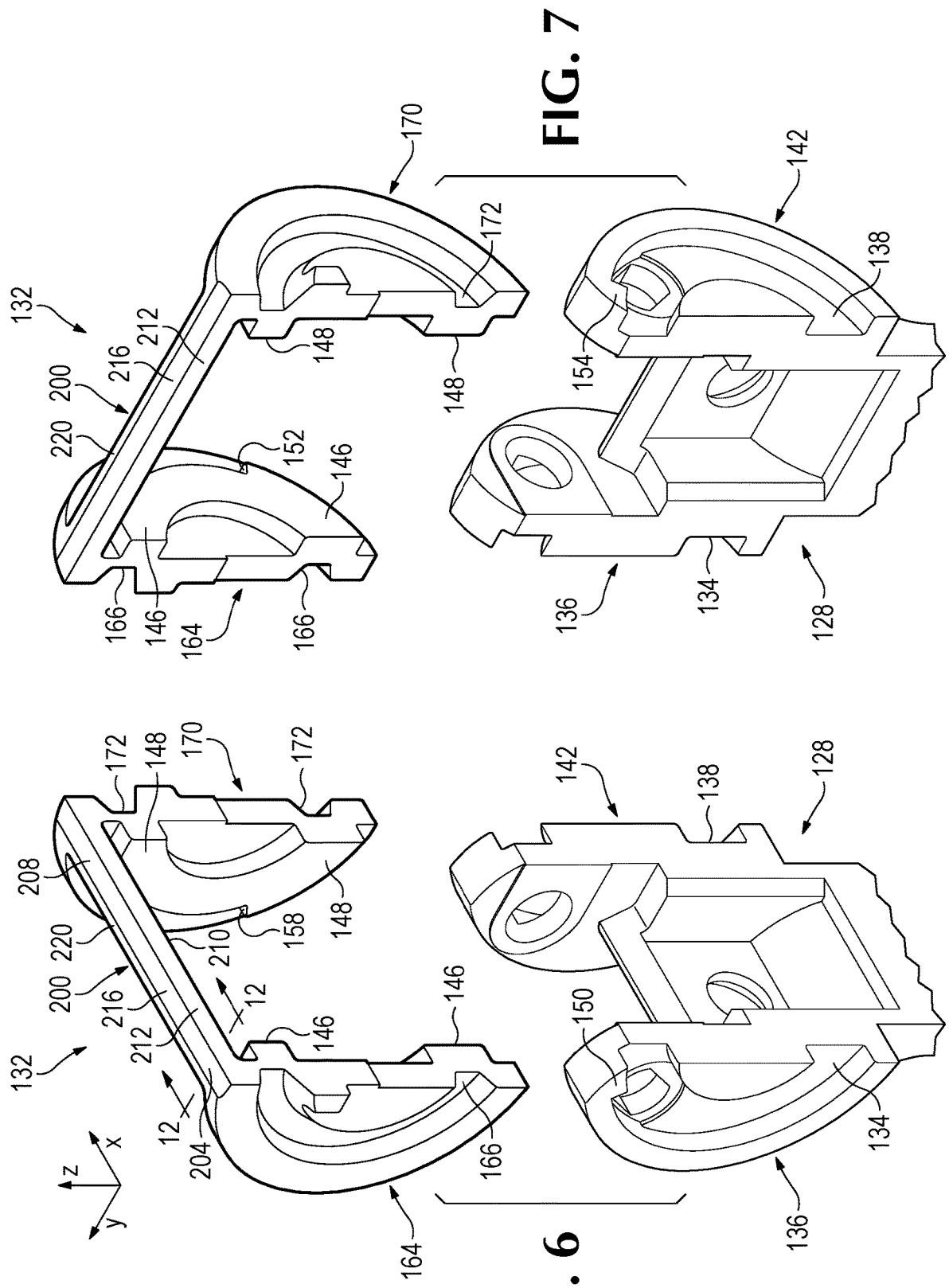

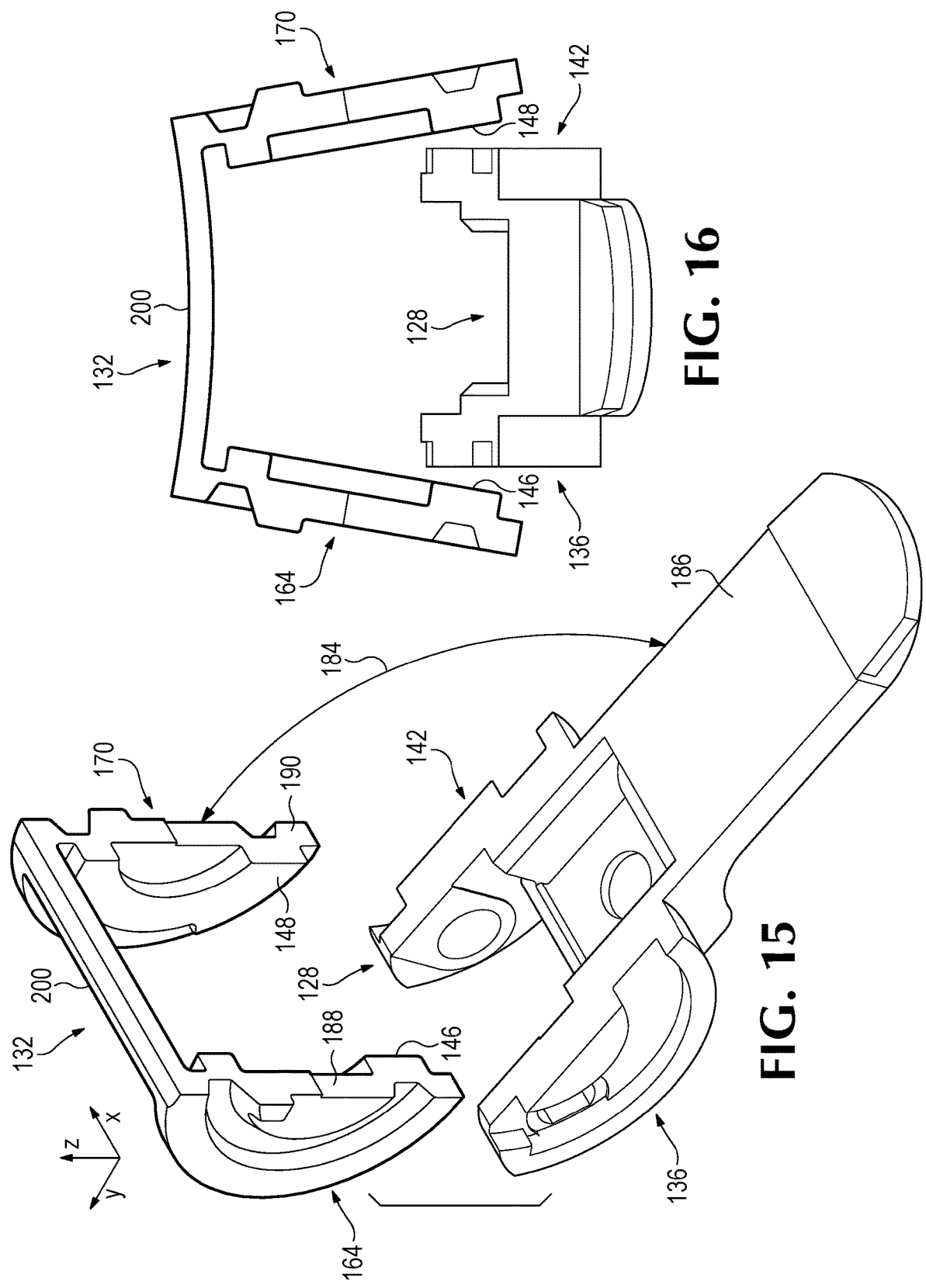

COMPUTING DEVICE HINGE ASSEMBLY

BACKGROUND

Some computing devices include low profile hinges that rotatably couple two substrates, such as a display and a kickstand support.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to hinge assemblies for computing devices and methods for assembling hinge assemblies. In one example, a hinge assembly for rotatably coupling a first substrate of a computing device to a second substrate comprises a hinge frame affixed to the first substrate and a hinge arm member affixed to the second substrate. The hinge arm member includes a first arcuate arm guide slot on a first side and a second arcuate arm guide slot on a second side opposite the first side.

An arm support member moveably couples the hinge arm member to the hinge frame. The arm support member comprises a first side including a first arcuate support guide slot that receives a first frame guide of the hinge frame. A second side opposite to the first side comprises a second arcuate support guide slot that receives a second frame guide of the hinge frame. A first arcuate inner support guide is received within the first arcuate arm guide slot of the hinge arm member, and a second arcuate inner support guide is received within the second arcuate arm guide slot of the hinge arm member. An elongated bridge member connects the first side of the arm support member to the second side, where the bridge member comprises a unitary structure fabricated from bulk metallic glass.

The method includes providing a hinge assembly as described above and aligning the first side of the arm support member with the first side of the hinge arm member and the second side of the arm support member with the second side of the hinge arm member. To enable the arm support member to move over the hinge arm member, the first side of the arm support member is biased away from the first side of the hinge arm member and the second side of the arm support member is biased away from the second side of the hinge arm member. The arm support member is then moved over the hinge arm member, and the biasing of the first side and the second side of the arm support member is released, thereby allowing the first arcuate inner support guide to be received within the first arcuate arm guide slot and the second arcuate inner support guide to be received within the second arcuate arm guide slot.

BRIEF DESCRIPTION OF THE DRAWINGS

FIG. 3 shows the hinge assembly in an intermediate position according to examples of the present disclosure.

FIG. 4 shows the hinge assembly in a maximum open orientation according to examples of the present disclosure.

FIG. 5 shows a partial view of a hinge arm member and arm support member of the hinge assembly according to examples of the present disclosure.

FIG. 6 shows one view of the hinge arm member and arm support member prior to assembly according to examples of the present disclosure.

FIG. 7 shows another view of the hinge arm member and arm support member prior to assembly according to examples of the present disclosure.

FIG. 15 shows an arm support member and hinge arm member prior to assembly and aligned relative to one another in an intermediate position according to examples of the present disclosure.

FIG. 16 shows the first and second sides of the arm support member biased away from the first and second sides of the hinge arm member to enable the arm support member to move over the hinge arm member according to examples of the present disclosure.

DETAILED DESCRIPTION

Different types of mobile computing devices may utilize two substrates that are rotatably coupled via one or more hinges. In some examples, tablet computing devices utilize a rotatable kickstand that may be stowed or deployed at different angles to conveniently position the tablet on a surface, such as for providing input via typing on a keyboard, viewing media, or reading. In a laptop device, a display is rotatably coupled to another substrate containing one or more input devices, such as a keyboard and a trackpad. Some devices may utilize two or more displays that are rotatable coupled via one or more hinges.

In mechanical assemblies such as hinges, structural components are often fabricated from high strength materials such as steel to provide extended duty cycles and a long useful life. Because these materials also embody relatively high elastic moduli, such as between approximately 190 GPa-210 GPa for some steel alloys, they can also impose limitations in manufacturing and fabrication of these assemblies, particularly in smaller form factor devices. For example, to enable assembly around a smaller component, a single steel component may be split into two parts that are separately positioned over the smaller component and then joined together, such as by welding. However, separating a component into two parts that are joined in this manner complicates the assembly process, adding additional steps and manufacturing line setups to accomplish the assembly. Further, joining the two parts creates a potentially weaker location at the joint.

Accordingly, examples are disclosed that relate to hinge assemblies for computing devices and methods for assembling hinge assemblies that simplify assembly processes and provide reliable operation over extended duty cycles. In the following discussion, an example computing device is described that employs the hinges and assembly techniques described herein. Embodiments of the present disclosure are not limited to the example device, and may be utilized with a variety of devices that rotatably couple two substrates and have different form factors and functions.

Figure 1:
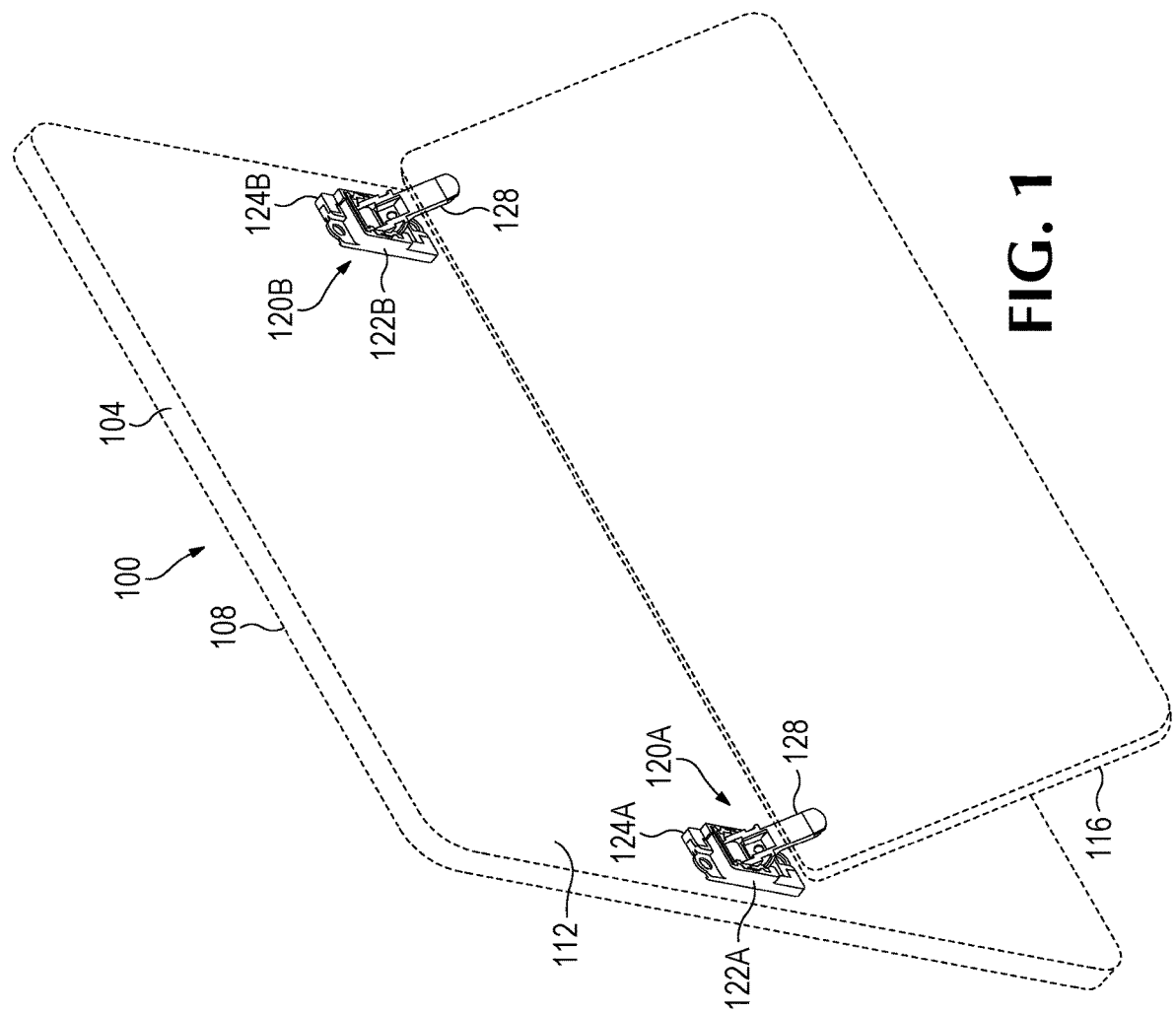
FIG. 1 shows one example of a computing device utilizing the hinge assembly according to examples of the present disclosure.
Figure 8:
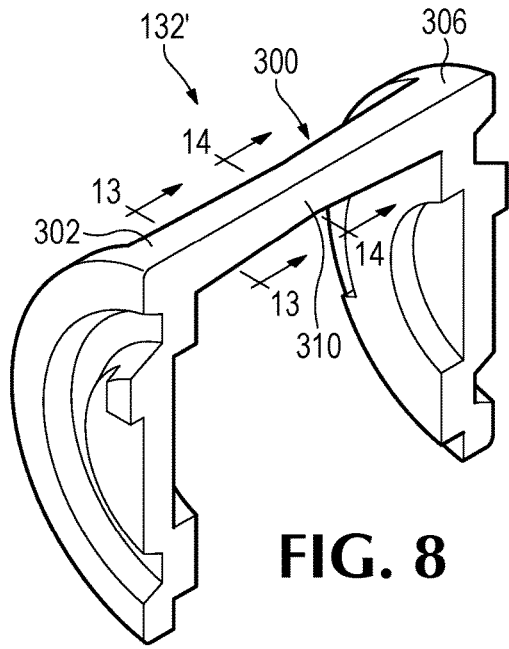
FIG. 8 shows another example of an arm support member including a bridge member having a non-uniform cross section along its length according to examples of the present disclosure.
Figure 9:
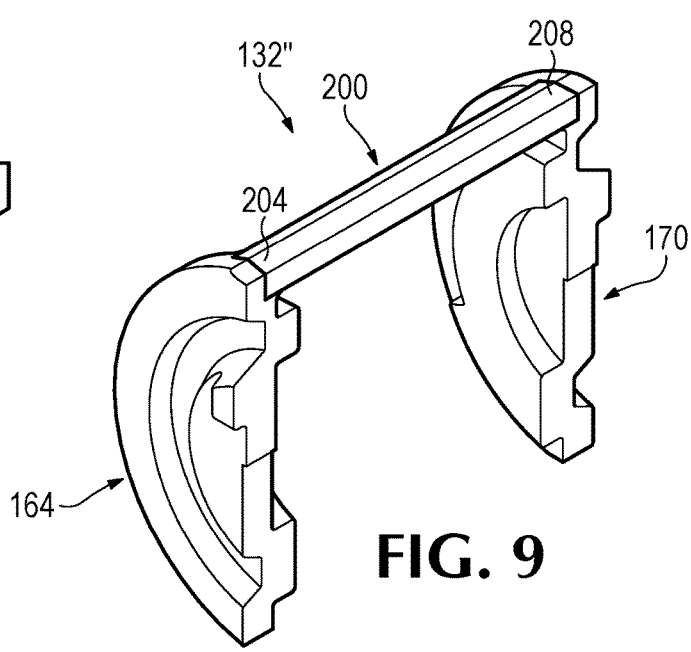
FIG. 9 shows another example of an arm support member including a bridge member fabricated from bulk metallic glass and first and second sides fabricated from a material other than bulk metallic glass.

With reference now to FIG. 1, one example of a computing device is illustrated in the form of a tablet computing device 100. In other examples, the computing device may take the form of a laptop computing device, dual-screen mobile computing device, or any other suitable computing device. In the example of FIG. 1, the tablet computing device 100 includes a first substrate 104 that comprises a touch screen display 108 (facing away in this view) and a rear panel 112 opposite to the display. The first substrate 104 is rotatably coupled to a kickstand 116 (second substrate) by a pair of hinge assemblies 120A and 120B. In other examples, a single hinge assembly 120 or three or more hinge assemblies 120 may be utilized to couple a first substrate to a second substrate.

As described in more detail below and with reference to FIG. 2, each of the hinge assemblies 120 comprises a hinge frame 121 that includes a first portion 122 and second portion 124. The first portion 122 and second portion 124 are joined to rotatably contain a hinge arm member 128 that is affixed to the kickstand 116. In different examples, the hinge arm member 128 is permanently affixed or removably affixed to the kickstand 116. As described and illustrated further below, an arm support member 132 moveably couples the hinge arm member 128 to the hinge frame 121. In this manner, the kickstand 116 can be rotated at the hinge assemblies 120 to a variety of angles relative to the rear panel 112, including from a closed orientation (at zero degrees) abutting the rear panel to a maximum open orientation, such as approximately 165 degrees.

In other examples and as noted above, the first substrate and second substrate may take other suitable forms, such as the display screen and input surface of a laptop computer, first and second display screens of a foldable and/or wearable device, or other types of computing devices.

Figure 2:
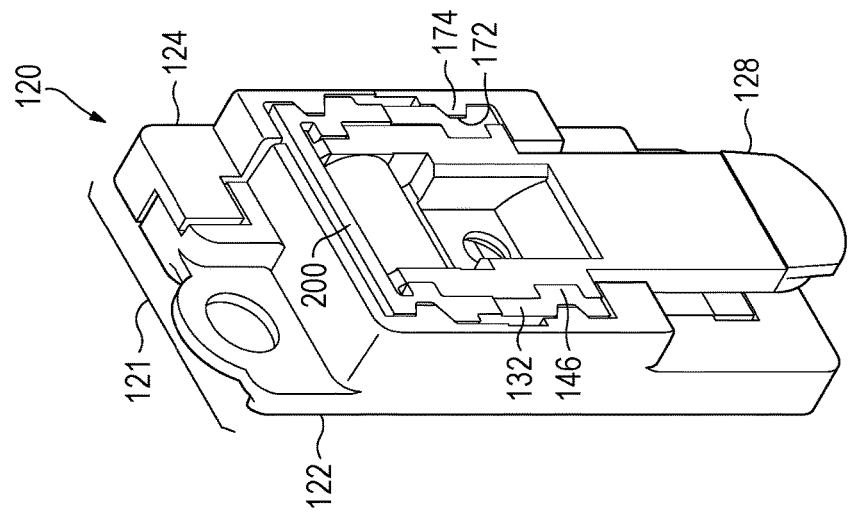
FIG. 2 shows the hinge assembly in a closed orientation according to examples of the present disclosure.

With reference now to FIGS. 2-13, descriptions of example hinge assemblies according to the present disclosure will now be provided. As shown in FIGS. 2-4, in one example the hinge arm member 128 is rotatably coupled to an arm support member 132 that enables the hinge arm member to rotate from the closed orientation shown in FIG. 2 to the maximum open orientation shown in FIG. 4. More particularly and with reference also to FIGS. 5 and 6, the hinge arm member 128 includes a first arcuate arm guide slot 134 on a first side 136 of the hinge arm member, and a second arcuate arm guide slot 138 on a second side 142 opposite to the first side. As shown in FIGS. 2-5, a first arcuate inner support guide 146 of the arm support member 132 is received within the first arcuate arm guide slot 134 of the hinge arm member 128. Similarly, a second arcuate inner support guide 148 of the arm support member 132 is received within the second arcuate arm guide slot 138 of the hinge arm member 128.

As shown in FIGS. 2-3, this configuration guides the hinge arm member 128 to rotate relative to the hinge frame portions 122 and 124 to an intermediate position shown in FIG. 3. From this intermediate position and with reference to FIG. 4, further rotation of the hinge arm member 128 causes the arm support member 132 to rotate outwardly relative to the hinge frame portions 122 and 124 to correspondingly allow the hinge arm member 128 to rotate to the maximum open orientation shown in FIG. 4. In one example, the intermediate position of FIG. 3 corresponds to an angle between the kickstand 116 and rear panel 112 of approximately 75 degrees, and the maximum open orientation of FIG. 4 corresponds to an angle between the kickstand 116 and rear panel 112 of approximately 165 degrees. In other examples, a variety of angles for the intermediate position and the maximum open orientation may be utilized.

In some examples at the intermediate position of FIG. 3, and with reference also to FIGS. 6 and 7, a first shoulder 150 of the first arcuate arm guide slot 134 contacts a first engagement surface 152 of the of the arm support member 132, and a second shoulder 154 of the second arcuate arm guide slot 138 contacts a second engagement surface 158 of the of the arm support member. Accordingly, as the hinge arm member 128 is further rotated past the intermediate position, the hinge arm member pulls the arm support member 132 to rotate relative to the first portion 122 and second portion 124 of the hinge frame 121. The hinge arm member 128 and arm support member 132 rotate together until the maximum open orientation is reached as shown in FIG. 4. At this position, a first and second protruding stops of the arm support member 132 contact corresponding stop features in the first portion 122 and second portion 124 of the hinge frame 121.

With reference also to FIGS. 2-7, to guide the arm support member 132 for arcuate movement relative to the first portion 122 and second portion 124 of the hinge frame 121, the first side 164 of arm support member comprises a first arcuate support guide slot 166 that receives a first frame guide 168 of the first portion of the hinge frame 121. Similarly, the second side 170 of arm support member 132 comprises a second arcuate support guide slot 172 that receives a second frame guide 174 of the second portion 124 of the hinge frame 121. In this manner, the first and second frame guides 168, 174 cooperate with the first and second arcuate support guide slots 166, 172 to allow the arm support member 132 to smoothly rotate outwardly with respect to the first portion 122 and second portion 124 of the hinge frame 121.

As shown in FIGS. 5-7, the first side 164 of the arm support member 132 is connected to the second side 170 by an elongated bridge member 200. With reference also to FIG. 16, to assemble the hinge arm member 128 inside the arm support member 132 to enable the relative movement between these two components as described above, the first side 164 and second side 170 of the arm support member 132 would need to be bent outwardly to provide clearance for the sides to move over the hinge arm member 128 and then released to move into their operational configuration as shown in FIG. 5.

As noted above in mechanical assemblies such as hinges, components such as the hinge arm member 128 and arm support member 132 are typically fabricated from high strength materials, such as steel. However, and particularly in smaller form factor components such as these, the elasticity of steel restricts the material's structural behavior to allow for only limited relative movements before permanent deformations and/or failure of a component occurs. For example, were an arm support member 132 to be fabricated from steel, an attempt to bias the first side 164 and second side 170 to the configuration shown in FIG. 16 would cause the elongated bridge member 200 to fail and snap into two pieces.

Also and as noted above, to enable assembly around a smaller component, in some examples a single component may be fabricated in two parts that are separately positioned relative to the smaller component and then joined together, such as by welding. However, separating a component into two parts in this manner complicates the assembly process, adding additional steps and manufacturing line setups to accomplish the assembly. Additionally, and with respect to the elongated bridge member 200, separating the bridge member near its center portion and welding the two ends together could create a structurally weaker location at this center portion.

In some examples of arm support member 132, and due to manufacturing tolerances and/or other factors, the first side 164 and second side 170 of the arm support member may be slightly canted relative to one another (e.g., not perfectly parallel). In these examples, movement of the first and second arcuate support guide slots 166, 172 of arm support member 132 relative to the corresponding first and second frame guides 168, 174 of the first and second portions 122, 124 of the hinge frame 121, respectively, can create two bending moments that act on the bridge member 200 and have their greatest magnitudes near the central portion of the bridge member. In examples where the arm support member 132 comprises two parts that are joined at or near the central portion of the bridge member 200, when the hinge arm member 128 and arm support member are repeatedly rotated, over time the repeated application of such moments to the central portion of the bridge member can correspondingly load the joint and weaken structural integrity at this location.

Accordingly, examples of the present disclosure utilize an arm support member 132 that comprises at least a bridge member 200 fabricated as a unitary structure from a bulk metallic glass material that enables simplified assembly of the arm support member over the hinge arm member 128 and provides extended duty cycles of relative movement between the components. For purposes of the present disclosure, bulk metallic glass is defined as an amorphous metal alloy that has a critical cooling rate low enough to allow formation of amorphous structures in layers greater than 1 millimeter. Advantageously, such materials embody relatively high strength coupled with a lower modulus of elasticity, thereby allowing for greater non-permanent deformations than other high strength materials. Accordingly and as described in more detail below, utilizing bulk metallic glass at least for the bridge member 200 enables this component to be fabricated as a unitary structure for greater structural integrity, while also allowing for substantial bending and flexing to enable assembly over the hinge arm member 128.

In some examples and as shown in FIGS. 3-7 and 15-16, the entire arm support member 132 is fabricated from bulk metallic glass. In these examples, and in one potential advantage of the present disclosure, the bridge member 200 is a unitary structure that is integrally formed with the first side 164 and second side 170 from bulk metallic glass. Accordingly and as described in more detail below, the first side 164, second side 170, and bridge member 200 embody a measure of flexibility that enable sufficient biasing of the two sides and corresponding flexing of the bridge member to allow the arm support member 132 to be moved over the hinge arm member 128 and then released to allow the first arcuate inner support guide 146 to be received within the first arcuate arm guide slot 134 and the second arcuate inner support guide 148 to be received within the second arcuate arm guide slot 138 (see FIG. 16).

Figure 10:
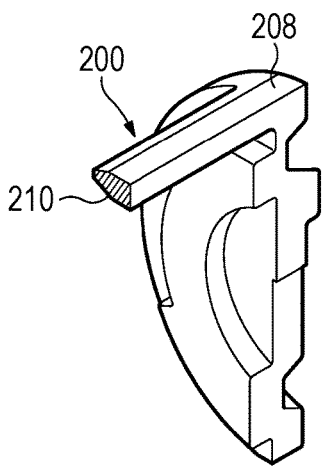
FIG. 10 shows a portion of the arm support member of FIG. 6 including a cross section at a central portion of its bridge member according to examples of the present disclosure.
Figure 12:
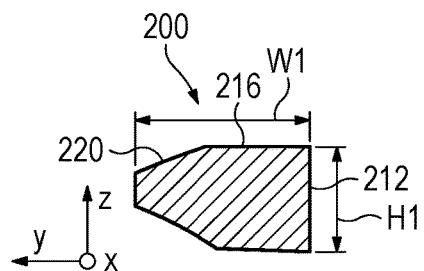
FIG. 12 is a cross section of the arm support member of FIG. 6 according to examples of the present disclosure.

With reference now to FIG. 12, a cross section of the bridge member 200 taken at line 12-12 of FIG. 6 is illustrated. In this example, the bridge member 200 of FIGS. 6 and 12 has a uniform cross section along its length in the x-axis direction from a first end 204 to an opposing second end 208. FIG. 10 also illustrates a cross section of bridge member 200 at central portion 210 midway between the first end 204 and the second end 208. In one potential advantage of this example configuration, the uniform cross section of the bridge member 200 along its length may evenly distribute bending loads imparted on the bridge member during assembly and operation.

As shown in FIG. 12, in this example the cross-sectional profile of bridge member 200 takes the form of a 6-sided polygon in which the height H1 of a front edge 212 is less than a combined width W1 of adjacent first side 216 and second side 220. In some examples, the ratio of the height H1 to the width W1 is approximately 0.6. In one example, the height H1 of front edge 212 is approximately 0.6 mm and the width W1 of the first and second sides 216, 220 is approximately 1.0 mm. In other examples, other suitable dimensions for the cross-sectional profile of bridge member 200 also may be utilized. Accordingly, and in one potential advantage of the present disclosure, by reducing the height H1 of front edge 212 with respect to the width W1 of sides 216 and 220, the bending stresses in the x-axis direction experienced by the bridge member 200 when bending during assembly (as described further below) are correspondingly reduced.

In some examples, a bulk metallic glass utilized for arm support member 132 may have a maximum stress (yield strength) of approximately 1039 MPa and a modulus of elasticity of approximately 80 GPa. Advantageously in these examples, and in another potential benefit of the present configuration, a structural analysis of the loads imparted on arm support member 132 during assembly of the arm support member to the hinge arm member 128 (described below) shows a maximum stress of below approximately 770 MPa, which is well below the 1039 MPa yield strength of the bulk metallic glass. Accordingly, the present configuration enables easy assembly of an arm support member 132 utilizing a unitary bridge member 200 that also provides high strength and high duty cycle performance.

Figure 11:
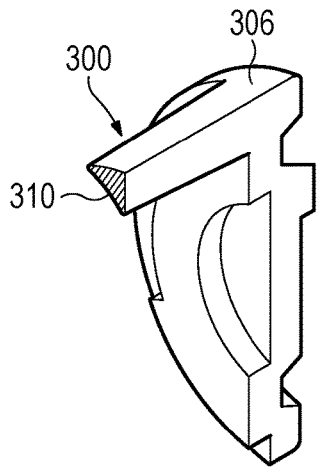
FIG. 11 shows a portion of the arm support member of FIG. 8 including a cross section at a central portion of its bridge member according to examples of the present disclosure.
Figure 13:
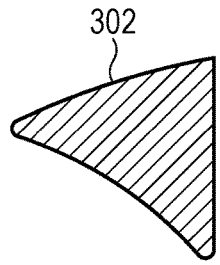
FIG. 13 is a cross section of the arm support member of FIG. 8 according to examples of the present disclosure.
Figure 14:
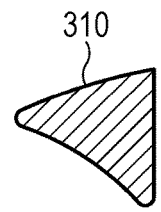
FIG. 14 is another cross section of the arm support member of FIG. 8 according to examples of the present disclosure.

In other examples of the present disclosure, the bridge member 200 may utilize a non-uniform cross section along its length. With reference now to FIGS. 8, 11, 13 and 14 and in one alternative example, an arm support member 132' utilizes a bridge member 300 that comprises a first end 302, a second end 306, and a central portion 310 midway between the first end and the second end. FIGS. 11 and 14 illustrates the cross section of bridge member 300 at central portion 310 midway between the first end 302 and the second end 306. In this example and as shown in FIGS. 13 and 14, the cross-sectional area of the bridge member 300 tapers from a first cross-sectional area at the first end 302 (FIG. 13) and the second end 306 to a second cross sectional area less than the first cross sectional area at the central portion 310 (FIG. 14). Accordingly, and in one potential advantage of this configuration, tapering the cross-sectional area in this manner reduces an amount of bulk metallic glass utilized for the bridge member 300 to reduce material costs. Additionally, providing larger cross-sectional areas at the ends of the bridge member 300 may better accommodate loads experienced in these locations.

In some alternative examples of the present disclosure, the bridge member is fabricated from bulk metallic glass while one or more other portions of the arm support member are fabricated from materials other than bulk metallic glass. In one example and with reference to FIG. 9, the first side 164 and second side 170 of another alternative example of an arm support member 132" are fabricated from an alloy having a crystalline atomic structure, such as steel. In this example, the bridge member 200 is fabricated from bulk metallic glass and is affixed to the first side 164 and second side 170 via any suitable technique. In the present example, bridge member 200 is laser welded to first side 164 and second side 170 at its first end 204 and second end 208, respectively. Accordingly, and in one potential benefit of this alternative configuration, by utilizing less expensive, high strength materials having a crystalline atomic structure for the first side 164 and second side 170, material costs for the arm support member 132 may be further reduced.

Figure 17:
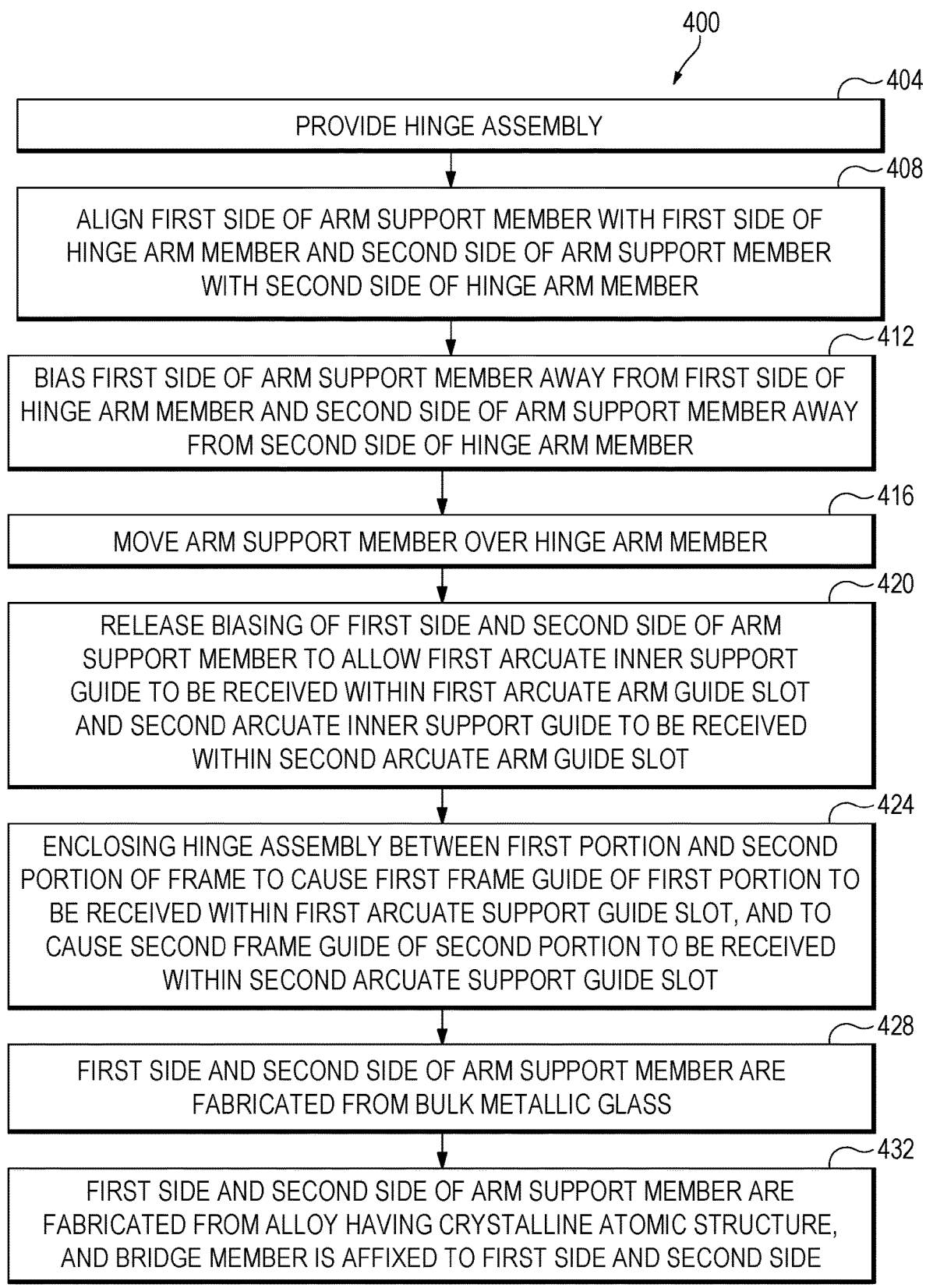
FIG. 17 shows a flow diagram of an example method of assembling a hinge assembly that rotatably couples a first substrate of a computing device to a second substrate of the computing device according to examples of the present disclosure.

With reference now to FIGS. 15-17, an example method 400 of assembling a hinge assembly that rotatably couples a first substrate of a computing device to a second substrate of the computing device will now be described. FIG. 17 illustrates a flow diagram depicting the method 400. The following description of method 400 is provided with reference to the components described herein and shown in FIGS. 1-14.

It will be appreciated that following description of method 400 is provided by way of example and is not meant to be limiting. Therefore, it is to be understood that method 400 may include additional and/or alternative steps relative to those illustrated in FIG. 17. Further, it is to be understood that the steps of method 400 may be performed in any suitable order. Further still, it is to be understood that one or more steps may be omitted from method 400 without departing from the scope of this disclosure. It will also be appreciated that method 400 also may be performed in other contexts using other suitable components.

With reference to FIG. 17, at 404 the method 400 includes providing a hinge assembly 120 as described herein and comprising a hinge frame 121; a hinge arm member 128 comprising a first arcuate arm guide slot 134 on a first side 136 of the hinge arm member and a second arcuate arm guide slot 138 on a second side 142 opposite the first side of the hinge arm member; and an arm support member 132 configured to moveably couple the hinge arm member to the hinge frame, the arm support member comprising: a first side 164 comprising a first arcuate support guide slot 166; a second side 170 opposite to the first side and comprising a second arcuate support guide slot 172; a first arcuate inner support guide 146; a second arcuate inner support guide 148; and an elongated bridge member connecting the first side of the arm support member to the second side, wherein the bridge member comprises a unitary structure fabricated from bulk metallic glass.

At 408 and with reference also to FIG. 15, the method 400 includes aligning the first side 164 of the arm support member 132 with the first side 136 of the hinge arm member 128 and the second side 170 of the arm support member with the second side 142 of the hinge arm member. As shown in the example of FIG. 15 and with reference also to FIG. 3, in this example the arm support member 132 and hinge arm member 128 are aligned in the intermediate position described above with respect to FIG. 3, which corresponds to an angle 184 of approximately 75 degrees between the extended portion 186 of the hinge arm member and the faces 188, 190 of arm support member first and second sides 164, 170 respectively. As described further below, in this orientation the first and second sides 164, 170 of arm support member 132 may be flexed outwardly to enable the arm support member to move over the hinge arm member 128.

With reference again to FIG. 17 and as shown in FIG. 16, at 412 the method 400 includes biasing the first side 164 of the arm support member 132 away from the first side 136 of the hinge arm member 128 and the second side 170 of the arm support member away from the second side 142 of the hinge arm member to enable the arm support member to move over the hinge arm member. As noted above, and in one potential advantage of the present disclosure, by utilizing bulk metallic glass for at least the bridge member 200, the first side 164 and second side 170 of the arm support member may be moved outwardly to provide clearance for the arm support member 132 to be moved over the hinge arm member 128. Further, such flexibility is provided while maintaining the bridge member 200 as a unitary structure and thereby avoiding joints along the length of the member that could reduce structural integrity.

With reference again to FIG. 17 and as shown in FIG. 16, at 416 the method 400 includes moving the arm support member 132 over the hinge arm member 128. At 420 and with reference also to FIG. 3, the method 400 includes releasing the biasing of the first side 164 and the second side 170 of the arm support member 132 to allow the first arcuate inner support guide 146 to be received within the first arcuate arm guide slot 134 and the second arcuate inner support guide 148 to be within the second arcuate arm guide slot 138.

At 424 the method 400 includes enclosing the hinge assembly 120 between the first portion 122 and the second portion 124 of the hinge frame 121 to cause the first frame guide 168 of the first portion to be received within the first arcuate support guide slot 166, and to cause the second frame guide 174 of the second portion 124 to be received within the second arcuate support guide slot 172. At 428 the method 400 may include wherein the first side 164 and the second side 170 of the arm support member 132 are fabricated from bulk metallic glass. As noted above, in some examples the entire arm support member 132 is fabricated from bulk metallic glass. At 432 the method 400 may include wherein the first side 164 and second side 170 of the arm support member 132 are fabricated from an alloy having a crystalline atomic structure, and the bridge member 200 is affixed to the first side and the second side. As noted above, in other examples the first side and second side of an arm support member are fabricated from an alloy having a crystalline atomic structure, such as steel, while the bridge member 200 is fabricated from bulk metallic glass and joined to the first and second sides.

The following paragraphs provide additional support for the claims of the subject application. One aspect provides a hinge assembly for rotatably coupling a first substrate of a computing device to a second substrate of the computing device, the hinge assembly comprising: a hinge frame affixed to the first substrate; a hinge arm member affixed to the second substrate, the hinge arm member comprising a first arcuate arm guide slot on a first side of the hinge arm member and a second arcuate arm guide slot on a second side opposite the first side of the hinge arm member; and an arm support member moveably coupling the hinge arm member to the hinge frame, the arm support member comprising: a first side comprising a first arcuate support guide slot, the first arcuate support guide slot receiving a first frame guide of the hinge frame; a second side opposite to the first side and comprising a second arcuate support guide slot, the second arcuate support guide slot receiving a second frame guide of the hinge frame; a first arcuate inner support guide received within the first arcuate arm guide slot of the hinge arm member; a second arcuate inner support guide received within the second arcuate arm guide slot of the hinge arm member; and an elongated bridge member connecting the first side of the arm support member to the second side, wherein the bridge member comprises a unitary structure fabricated from bulk metallic glass. The hinge assembly may additionally or alternative include, wherein the first side and the second side of the arm support member are fabricated from bulk metallic glass. The hinge assembly may additionally or alternative include, wherein the first side and second side of the arm support member are fabricated from an alloy having a crystalline atomic structure, and the bridge member is affixed to the first side and the second side.

The hinge assembly may additionally or alternative include, wherein the bridge member has a cross sectional profile in which a height of the profile is less than a width of the profile. The hinge assembly may additionally or alternative include, wherein a ratio of the height to the width is approximately 0.6. The hinge assembly may additionally or alternative include, wherein the bridge member has a uniform cross section along its length. The hinge assembly may additionally or alternative include, wherein the bridge member has a non-uniform cross section along its length. The hinge assembly may additionally or alternative include, wherein the bridge member comprises a first end, a second end, and a central portion midway between the first end and the second end, and a cross sectional area of the bridge member tapers from a first cross sectional area at the first end and at the second end to a second cross sectional area less than the first cross sectional area at the central portion.

Another aspect provides a computing device, comprising: a display substrate; and a kickstand rotatably coupled to the display substrate via a hinge assembly, wherein the hinge assembly comprises: a hinge frame affixed to the display substrate; a hinge arm member affixed to the kickstand, the hinge arm member comprising a first arcuate arm guide slot on a first side of the hinge arm member and a second arcuate arm guide slot on a second side opposite the first side of the hinge arm member; and an arm support member moveably coupling the hinge arm member to the hinge frame, the arm support member comprising: a first side comprising a first arcuate support guide slot, the first arcuate support guide slot receiving a first frame guide of the hinge frame; a second side opposite to the first side and comprising a second arcuate support guide slot, the second arcuate support guide slot receiving a second frame guide of the hinge frame; a first arcuate inner support guide received within the first arcuate arm guide slot of the hinge arm member; a second arcuate inner support guide received within the second arcuate arm guide slot of the hinge arm member; and an elongated bridge member connecting the first side of the arm support member to the second side, wherein the bridge member comprises a unitary structure fabricated from bulk metallic glass. The computing device may additionally or alternative include, wherein the first side and the second side of the arm support member are fabricated from bulk metallic glass. The computing device may additionally or alternative include, wherein the first side and second side of the arm support member are fabricated from an alloy having a crystalline atomic structure, and the bridge member is affixed to the first side and the second side.

The computing device may additionally or alternative include, wherein the bridge member has a cross sectional profile in which a height of the profile is less than a width of the profile. The computing device may additionally or alternative include, wherein a ratio of the height to the width is approximately 0.6. The computing device may additionally or alternative include, wherein the bridge member has a uniform cross section along its length. The computing device may additionally or alternative include, wherein the bridge member has a non-uniform cross section along its length. The computing device may additionally or alternative include, wherein the bridge member comprises a first end, a second end, and a central portion midway between the first end and the second end, and a cross sectional area of the bridge member tapers from a first cross sectional area at the first end and at the second end to a second cross sectional area less than the first cross sectional area at the central portion.

Another aspect provides a method of assembling a hinge assembly that rotatably couples a first substrate of a computing device to a second substrate of the computing device, the method comprising: providing the hinge assembly comprising: a hinge frame; a hinge arm member comprising a first arcuate arm guide slot on a first side of the hinge arm member and a second arcuate arm guide slot on a second side opposite the first side of the hinge arm member; and an arm support member configured to moveably couple the hinge arm member to the hinge frame, the arm support member comprising: a first side comprising a first arcuate support guide slot; a second side opposite to the first side and comprising a second arcuate support guide slot; a first arcuate inner support guide; a second arcuate inner support guide; and an elongated bridge member connecting the first side of the arm support member to the second side, wherein the bridge member comprises a unitary structure fabricated from bulk metallic glass; aligning the first side of the arm support member with the first side of the hinge arm member and the second side of the arm support member with the second side of the hinge arm member; biasing the first side of the arm support member away from the first side of the hinge arm member and the second side of the arm support member away from the second side of the hinge arm member to enable the arm support member to move over the hinge arm member; moving the arm support member over the hinge arm member; and releasing the biasing of the first side and the second side of the arm support member to allow the first arcuate inner support guide to be received within the first arcuate arm guide slot and the second arcuate inner support guide to be received within the second arcuate arm guide slot. The method may additionally or alternatively include, wherein the hinge frame comprises a first portion and a second portion, the method comprising: enclosing the hinge frame between the first portion and the second portion to cause a first frame guide of the first portion to be received within the first arcuate support guide slot, and to cause a second frame guide of the second portion to be received within the second arcuate support guide slot. The method may additionally or alternatively include, wherein the first side and the second side of the arm support member are fabricated from bulk metallic glass. The method may additionally or alternatively include, wherein the first side and second side of the arm support member are fabricated from an alloy having a crystalline atomic structure, and the bridge member is affixed to the first side and the second side.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A hinge assembly for rotatably coupling a first substrate of a computing device to a second substrate of the computing device, the hinge assembly comprising:
 a hinge frame affixed to the first substrate;
 a hinge arm member affixed to the second substrate, the hinge arm member comprising a first arcuate arm guide slot on a first side of the hinge arm member and a second arcuate arm guide slot on a second side opposite the first side of the hinge arm member; and
 an arm support member moveably coupling the hinge arm member to the hinge frame, the arm support member comprising:
  a first side comprising a first arcuate support guide slot, the first arcuate support guide slot receiving a first frame guide of the hinge frame;
  a second side opposite to the first side and comprising a second arcuate support guide slot, the second arcuate support guide slot receiving a second frame guide of the hinge frame;
  a first arcuate inner support guide received within the first arcuate arm guide slot of the hinge arm member;
  a second arcuate inner support guide received within the second arcuate arm guide slot of the hinge arm member; and
  an elongated bridge member connecting the first side of the arm support member to the second side, wherein the bridge member comprises a unitary structure fabricated from bulk metallic glass, wherein the bridge member has a cross sectional profile with a height to width ratio of approximately 0.6.

2. The hinge assembly of claim 1, wherein the first side and the second side of the arm support member are fabricated from bulk metallic glass.

3. The hinge assembly of claim 1, wherein the first side and second side of the arm support member are fabricated from an alloy having a crystalline atomic structure, and the bridge member is affixed to the first side and the second side.

4. The hinge assembly of claim 1, wherein the bridge member has a uniform cross section along its length.

5. The hinge assembly of claim 1, wherein the bridge member has a non-uniform cross section along its length.

6. The hinge assembly of claim 5, wherein the bridge member comprises a first end, a second end, and a central portion midway between the first end and the second end, and a cross sectional area of the bridge member tapers from a first cross sectional area at the first end and at the second end to a second cross sectional area less than the first cross sectional area at the central portion.

7. A computing device, comprising:
 a display substrate; and
 a kickstand rotatably coupled to the display substrate via a hinge assembly, wherein the hinge assembly comprises:
  a hinge frame affixed to the display substrate;
  a hinge arm member affixed to the kickstand, the hinge arm member comprising a first arcuate arm guide slot on a first side of the hinge arm member and a second arcuate arm guide slot on a second side opposite the first side of the hinge arm member; and
  an arm support member moveably coupling the hinge arm member to the hinge frame, the arm support member comprising:
   a first side comprising a first arcuate support guide slot, the first arcuate support guide slot receiving a first frame guide of the hinge frame;
   a second side opposite to the first side and comprising a second arcuate support guide slot, the second arcuate support guide slot receiving a second frame guide of the hinge frame;
   a first arcuate inner support guide received within the first arcuate arm guide slot of the hinge arm member;
   a second arcuate inner support guide received within the second arcuate arm guide slot of the hinge arm member; and
   an elongated bridge member connecting the first side of the arm support member to the second side, wherein the bridge member comprises a unitary structure fabricated from bulk metallic glass, wherein the bridge member has a cross sectional profile with a height to width ratio of approximately 0.6.

8. The computing device of claim 7, wherein the first side and the second side of the arm support member are fabricated from bulk metallic glass.

9. The computing device of claim 7, wherein the first side and second side of the arm support member are fabricated from an alloy having a crystalline atomic structure, and the bridge member is affixed to the first side and the second side.

10. The computing device of claim 7, wherein the bridge member has a uniform cross section along its length.

11. The computing device of claim 7, wherein the bridge member has a non-uniform cross section along its length.

12. The computing device of claim 11, wherein the bridge member comprises a first end, a second end, and a central portion midway between the first end and the second end, and a cross sectional area of the bridge member tapers from a first cross sectional area at the first end and at the second end to a second cross sectional area less than the first cross sectional area at the central portion.

* * * * *